(12) United States Patent
Shibukawa et al.

(10) Patent No.: US 11,195,907 B2
(45) Date of Patent: Dec. 7, 2021

(54) SEMICONDUCTOR DEVICE AND SEMICONDUCTOR DEVICE MANUFACTURING METHOD

(71) Applicant: SHINDENGEN ELECTRIC MANUFACTURING CO., LTD., Tokyo (JP)

(72) Inventors: Akihiko Shibukawa, Hanno (JP); Yusuke Maeyama, Hanno (JP); Shunichi Nakamura, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/963,751

(22) PCT Filed: Feb. 13, 2018

(86) PCT No.: PCT/JP2018/004921
§ 371 (c)(1),
(2) Date: Jul. 21, 2020

(87) PCT Pub. No.: WO2019/159237
PCT Pub. Date: Aug. 22, 2019

(65) Prior Publication Data
US 2020/0357882 A1 Nov. 12, 2020

(51) Int. Cl.
*H01L 29/06* (2006.01)
*H01L 29/16* (2006.01)
*H01L 29/872* (2006.01)

(52) U.S. Cl.
CPC ...... *H01L 29/0619* (2013.01); *H01L 29/1608* (2013.01); *H01L 29/872* (2013.01)

(58) Field of Classification Search
None
See application file for complete search history.

(56) References Cited

U.S. PATENT DOCUMENTS

| 2012/0097980 A1 | 4/2012 | Masuda et al. |
| 2015/0108564 A1 | 4/2015 | Miura et al. |
| | (Continued) | |

FOREIGN PATENT DOCUMENTS

| JP | 2009-224661 A | 10/2009 |
| JP | 2013-105798 A | 5/2013 |
| | (Continued) | |

OTHER PUBLICATIONS

International Search Report dated May 15, 2018 in International Application No. PCT/JP2018/004921, with English translation, 2 pages.

(Continued)

*Primary Examiner* — Jack S Chen
(74) *Attorney, Agent, or Firm* — Nixon & Vanderhye P.C.

(57) ABSTRACT

A semiconductor device includes: a drift layer of a first conductivity type which is made of silicon carbide; a junction region formed on one main surface of the drift layer; a junction termination extended region of the drift layer, the junction termination extended region being formed outside the junction region when the one main surface is viewed in plan view, and the junction termination extended region containing an impurity of a second conductivity type opposite to the first conductivity type; and a guard ring region of the drift layer, the guard ring region being formed at a position overlapping the junction termination extended region when the one main surface is viewed in plan view, and the guard ring region containing the impurity of the second conductivity type with a concentration that is higher than that of the junction termination extended region, wherein in the junction termination extended region, the concentration of the impurity of the second conductivity type in a depth direction from the one main surface increases from the one main surface down to a first depth, and the (Continued)

concentration of the impurity of the second conductivity type at the one main surface is one tenth or less the concentration of the impurity of the second conductivity type at the first depth and is higher than a concentration of an impurity of the first conductivity type of the drift layer.

6 Claims, 8 Drawing Sheets

(56) References Cited

U.S. PATENT DOCUMENTS

2016/0218187 A1    7/2016  Mochizuki et al.
2020/0357882 A1*  11/2020  Shibukawa ............. H01L 29/36

FOREIGN PATENT DOCUMENTS

WO    WO 2014/184839 A1    11/2014
WO    WO 2015/033463 A1    3/2015

OTHER PUBLICATIONS

International Preliminary Report on Patentability dated Jan. 29, 2019 in International Application No. PCT/JP2018/004921, with English translation, 8 pages.
Extended European Search Report dated Aug. 4, 2021 in European Application No. 18906006.4, 8 pages.

* cited by examiner

SEMICONDUCTOR DEVICE AND SEMICONDUCTOR DEVICE MANUFACTURING METHOD

This application is the U.S. national phase of International Application No. PCT/JP2018/004921 filed 13 Feb. 2018, the entire contents of which is hereby incorporated by reference.

TECHNICAL FIELD

The present invention relates to a semiconductor device and a semiconductor device manufacturing method.

BACKGROUND ART

Since silicon carbide (SiC) is a wide-gap semiconductor that has a breakdown electric field strength about 10 times that of silicon (Si), it is used as a material for high breakdown voltage semiconductor devices.

Conventionally, some semiconductor devices made of silicon carbide have a guard ring region (GR) in order to reduce electric field concentration near an interface to achieve a high breakdown voltage (see, for example, Patent Document 1). Additionally, there is also a semiconductor device having a junction termination extended region (JTE) in order to increase the breakdown voltage.

CITATION LIST

[Patent Document 1]
Patent Document 1: Japanese Patent Application Publication No. 2009-224661

SUMMARY OF THE INVENTION

Problems to be Solved by the Invention

By the way, a termination structure in which a guard ring region is provided in the junction termination extended region (hereinafter, referred to as "JTE+GR structure") is also conceivable in order to further increase the breakdown voltage. FIG. 7 is an example of a semiconductor device 500 having a JTE+GR structure. FIG. 7 is a sectional view of the semiconductor device 500 having the JTE+GR structure. The JTE+GR structure is formed by ion-implanting a p type impurity (for example, aluminum (Al)) into an n type drift layer 510b formed on an n type semiconductor substrate 510a. Specifically, first, a low concentration of the p type impurity is ion-implanted into a predetermined region that surrounds, in plan view from a surface of the drift layer 510b, a junction region 515 where an electrode is formed on the surface of the drift layer 510b, thus forming the junction termination extended region 513. In the junction termination extended region 513, ion implantation is performed so that an impurity concentration, after the ion implantation, has a box-shaped concentration distribution in which the impurity concentration is substantially constant from the surface of the drift layer 510b to a predetermined depth. Next, in the junction termination extended region 513, a high concentration of the p type impurity is ion-implanted into a plurality of ring-shaped regions surrounding the junction region 515 in the plan view from the surface of the drift layer 510b, thus forming a guard ring region 514. As a result, the JTE+GR structure is formed.

Since the breakdown voltage of a semiconductor device having such a JTE+GR structure is determined by a dose amount of the impurity, it is possible to obtain a semiconductor device having a desired breakdown voltage with a relatively easy design and manufacturing method by controlling the dose amount.

In the semiconductor device manufacturing method including the method of forming the above JTE+GR structure, in some cases, the p type impurity on the surface of the junction termination extended region diffuses outward (hereinafter, referred to as "outward diffusion") through an activation annealing step and a thermal oxidation step which are performed after the ion implantation.

When the outward diffusion occurs, the actual number of p type impurities will be less than the designed dose. As a result, the actually manufactured semiconductor device has a problem that the breakdown voltage as designed cannot be obtained. This problem is particularly noticeable when the activation annealing step and the thermal oxidation step are performed at 1600° C. or higher.

Further, as shown in FIG. 8, the surface of the junction termination extended region 513 becomes n type due to the outward diffusion. Reference numeral 518 in FIG. 8 indicates a region, in the semiconductor device 500 shown in FIG. 7, where the surface of the junction termination extended region 513 has become n type due to the outward diffusion.

For this reason, when a voltage is applied to the semiconductor device 500, carriers stay in the surface region (region 518 that has become n type) sandwiched by the guard ring regions 514. As a result, there occurs a problem that the breakdown voltage of the semiconductor device becomes unstable.

The present invention has been made in view of the above problems, and provides a semiconductor device and a manufacturing method thereof for providing a semiconductor device capable of stably obtaining a desired breakdown voltage as designed.

Means for Solving the Problems

A semiconductor device according to an aspect of the present invention is a semiconductor device including: a drift layer of a first conductivity type which is made of silicon carbide; a junction region formed on one main surface of the drift layer; a junction termination extended region of the drift layer, the junction termination extended region being formed outside the junction region when the one main surface is viewed in plan view, and the junction termination extended region containing an impurity of a second conductivity type opposite to the first conductivity type; and a guard ring region of the drift layer, the guard ring region being formed at a position overlapping the junction termination extended region when the one main surface is viewed in plan view, and the guard ring region containing the impurity of the second conductivity type with a concentration that is higher than that of the junction termination extended region, wherein in the junction termination extended region, the concentration of the impurity of the second conductivity type in a depth direction from the one main surface increases from the one main surface down to a first depth, and the concentration of the impurity of the second conductivity type at the one main surface is one tenth or less the concentration of the impurity of the second conductivity type at the first depth and is higher than a concentration of an impurity of the first conductivity type of the drift layer.

Further, a semiconductor device manufacturing method according to an aspect of the present invention is a semiconductor device manufacturing method including: a semiconductor substrate preparation step of preparing a semiconductor substrate including a drift layer of a first conductivity type which is made of silicon carbide; a junction region formation step of forming a junction region on one main surface of the drift layer; a junction termination extended region formation step of introducing from the one main surface into the drift layer, an impurity of a second conductivity type opposite to the first conductivity type, thus forming a junction termination extended region outside the junction region when the one main surface is viewed in plan view; and a guard ring region formation step of introducing from the one main surface into the drift layer, the impurity of the second conductivity type with a concentration that is higher than that of the junction termination extended region, thus forming a guard ring region at a position overlapping the junction termination extended region when the one main surface is viewed in plan view, wherein in the junction termination extended region formation step, the junction termination extended region is formed so that the concentration of the impurity of the second conductivity type in a depth direction from the one main surface increases from the one main surface down to a first depth, and the concentration of the impurity of the second conductivity type at the one main surface is one tenth or less the concentration of the impurity of the second conductivity type at the first depth and is higher than a concentration of an impurity of the first conductivity type of the drift layer.

Effects of the Invention

According to the semiconductor device and the semiconductor device manufacturing method of the present invention, the concentration of the p type impurity in the junction termination extended region increases from the surface down to a certain depth, instead of the box-shaped distribution, and the concentration of the p type impurity on the surface are one tenth or less the concentration at that depth. Therefore, it is possible to suppress a decrease in the number of p type impurities due to the outward diffusion. As a result, it is possible to obtain a desired breakdown voltage as designed in actually manufactured semiconductor devices.

Additionally, according to the semiconductor device and the semiconductor device manufacturing method of the present invention, the concentration of the p type impurity on the surface is higher than the concentration of the n type impurity in the drift layer. Therefore, it is possible to suppress carrier retention at the time of voltage application, which is caused by the surface becoming n type due to the outward diffusion. As a result, a desired breakdown voltage can be stably obtained.

MODE FOR CARRYING OUT THE INVENTION

First Embodiment

Figure 1:
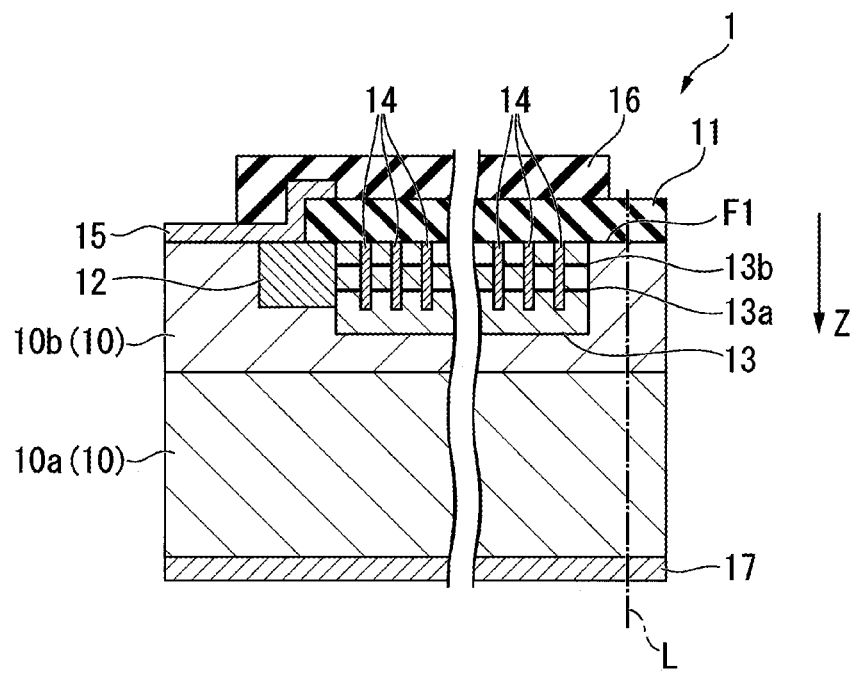
FIG. 1 is a cross-sectional view showing a configuration of a semiconductor device according to a first embodiment.

Hereinafter, a first embodiment of the present invention will be described with reference to FIGS. 1 to 6.

It should be noted that the present embodiment is specifically described for better understanding of the gist of the invention, and does not limit the present invention unless otherwise specified. Further, in the drawings used in the following description, in order to facilitate understanding of features of the present invention, essential parts are occasionally enlarged and shown for convenience, and the dimensional ratios of the respective components are not necessarily the same as actual ones.

(Configuration of Semiconductor Device)

Hereinafter, a configuration of the semiconductor device according to the present embodiment will be described with reference to FIGS. 1 and 2. FIG. 1 shows a cross section along A-A in FIG. 2. The semiconductor device according to the present embodiment is a Schottky diode.

Figure 2:
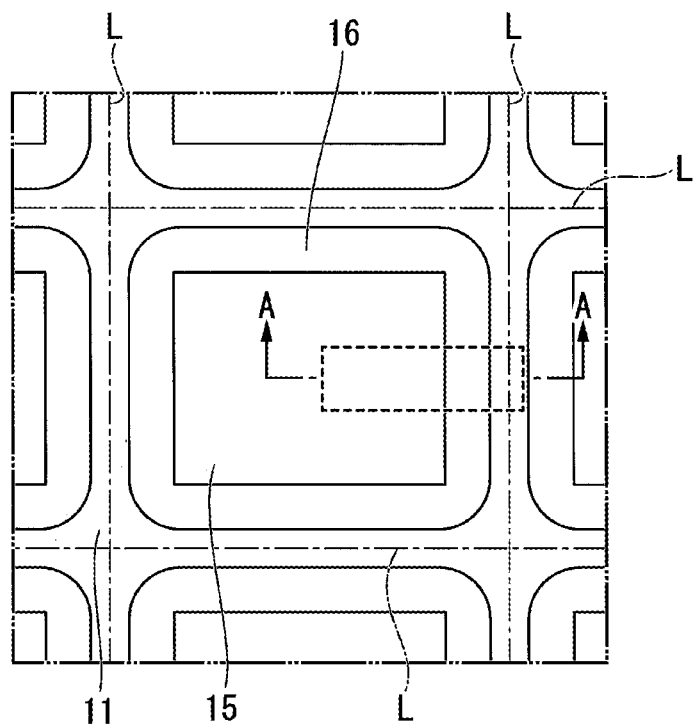
FIG. 2 is a plan view showing the configuration of the semiconductor device according to the first embodiment.

As shown in FIG. 2, a plurality of semiconductor devices are formed on a semiconductor substrate so as to be vertically and horizontally adjacent to one another, and then the semiconductor substrate is cut in vertical and horizontal directions along cutting lines L, thus obtaining the semiconductor device according to the present embodiment.

As shown in FIG. 1, the semiconductor device 1 includes a semiconductor substrate 10, a first insulating film 11, a p type region 12, a junction termination extended region 13, a guard ring region 14, and a first electrode (junction region) 15, a second insulating film 16, and a second electrode 17. The semiconductor substrate 10 includes a semiconductor substrate 10a and a drift layer 10b.

The semiconductor substrate 10a is made of silicon carbide (SiC), and has an n type (first conductivity type) impurity introduced therein. The semiconductor substrate 10a is an n+ type silicon carbide single crystal substrate. The semiconductor substrate 10a is, for example, a (0001) plane n type 4H-SiC substrate.

The drift layer 10b is made of silicon carbide and is formed on one main surface of the semiconductor substrate 10a. The n type impurity is introduced into the drift layer 10b at a concentration lower than that of the semiconductor substrate 10a.

The second electrode 17 is formed on the other main surface of the semiconductor substrate 10a. The drift layer 10$b$ and the second electrode 17 are ohmic-connected via the semiconductor substrate 10$a$. The second electrode 17 may be formed of, for example, titanium nitride.

The p type region 12 is made of silicon carbide and is formed on one main surface F1 of the drift layer 10$b$ opposite to the semiconductor substrate 10$a$. The p type region 12 is an annular region in plan view viewed from the main surface F1 side of the drift layer 10$b$ (hereinafter, sometimes simply referred to as "plan view"). The p type region 12 is formed so as to overlap, in plan view, an edge portion of the first electrode (junction region) 15 described later. A p type (second conductivity type) impurity is introduced into the p type region 12.

The junction termination extended region 13 is made of silicon carbide and is formed on the one main surface F1 of the drift layer 10$b$. The junction termination extended region 13 is an annular region in plan view, and is formed outside adjacent to the p type region 12. The p type impurity with a lower concentration than that of the p type region 12 is introduced into the junction termination extended region 13.

The guard ring region 14 is made of silicon carbide and is formed on the one main surface F1 of the drift layer 10$b$. The guard ring region 14 is a plurality of annular regions in plan view, which are formed in a substantially concentric shape inside the junction termination extended region 13. That is, the guard ring region 14 is formed in plan view, at a position overlapping the junction termination extended region 13. The guard ring region 14 may be formed, for example, at a position outside the junction termination extended region 13 in a radial direction of the junction termination extended region 13 (a position not overlapping the junction termination extended region 13), in addition to the position overlapping the junction termination extended region 13. The p type impurity with a higher concentration than that of the junction termination extended region 13 is introduced into the guard ring region 14.

The first insulating film 11 is made of an insulator and is formed on the one main surface F1 of the drift layer 10$b$. The first insulating film 11 covers the junction termination extended region 13 and the guard ring region 14. The first insulating film 11 has an opening. The opening is formed so that the n type region of the drift layer 10$b$ surrounded by the p type region 12 is exposed in plan view.

The first electrode (junction region) 15 is formed so as to contact the n type region of the drift layer 10$b$ exposed in the opening of the first insulating film 11. The first electrode 15 is formed so that an edge portion thereof covers the edge of the first insulating film 11. The edge portion of the first electrode 15 is formed so as to overlap the p type region 12 in plan view. The first electrode 15 may be made of, for example, titanium.

The second insulating film 16 is made of an insulator. The second insulating film 16 is laminated and formed on the edge portions of the first insulating film 11 and the first electrode 15 so that a central portion of the first electrode 15 is exposed. The second insulating film 16 is formed so as to cover, in a plan view, the p type region 12 and the junction termination extended region 13 including the guard ring region 14.

The concentration of the p type impurity in the junction termination extended region 13 (hereinafter, sometimes simply referred to as "impurity concentration") has the following distribution in a depth direction $z$ from the one main surface F1. The impurity concentration increases from the one main surface F1 down to a first depth 13$b$. When the depth becomes deeper than the first depth 13$b$, the impurity concentration once decreases and then increases until the depth reaches a second depth 13$a$ which is deeper than the first depth 13$b$. The impurity concentration decreases as the depth goes deeper than the second depth 13$a$. Thus, the distribution of the impurity concentration in the depth direction $z$ from the one main surface F1 has two peaks at the first depth 13$b$ and the second depth 13$a$. The difference in impurity concentration between the first depth 13$b$ and the second depth 13$a$ is preferably small. In this case, the distribution of the impurity concentration in the junction termination extended region 13 can be made closer to the box-shaped impurity concentration distribution.

The impurity concentration at the one main surface F1 is one tenth or less the impurity concentration at the first depth 13$b$. The impurity concentration at the one main surface F1 is higher than the concentration of the n type impurity in the drift layer 10$b$.

By forming the impurity concentration distribution having two peaks, the number of times of ion implantation is reduced as compared with the case of forming the box-shaped impurity concentration distribution, so that the manufacturing cost of the semiconductor device can be reduced.

Silicon carbide is a relatively hard semiconductor. Therefore, in the semiconductor substrate 10 formed of silicon carbide, especially in the inside (bulk region) of the drift layer 10$b$, the p type impurity is difficult to diffuse. Therefore, it is considered that even if the drift layer 10$b$ is heated after the p type impurity is introduced into the drift layer 10$b$, the impurity concentration does not substantially decrease and is maintained substantially.

On the other hand, on the surface of the drift layer 10$b$, the number of adjacent atoms of the atoms forming the drift layer 10$b$ is smaller than that in the inside (bulk region). Therefore, it is considered that the hardness in the vicinity of the surface of the drift layer 10$b$ is lower than that in the inside (bulk region). Therefore, it is considered that the p type impurity introduced in the vicinity of the surface is more likely to diffuse than in the inside (bulk region). Therefore, when the p type impurity is introduced, if the impurity concentration is set to a box-shaped distribution in which the impurity concentration is substantially constant from the surface of the drift layer 10$b$ to a predetermined depth, when the drift layer 10$b$ is heated in a subsequent process, it is considered that a larger proportion of the impurity diffuses in the vicinity of the surface than in the inside (bulk region), and moves from the junction termination extended region 13 to the outside (that is, outward diffusion occurs).

In the semiconductor device according to the present embodiment, in the junction termination extended region 13, the impurity concentration increases as the depth from the one main surface F1 increases from the one main surface F1 down to the first depth 13$b$. Therefore, after the impurity is introduced, while the drift layer 10$b$ is heated, even if a larger proportion of the impurity diffuses in the vicinity of the one main surface F1 (surface) than in the inside (bulk region), the amount of the p type impurity introduced in the vicinity of the one main surface F1 (surface) before the heating is smaller than the amount of the p type impurity introduced at the first depth 13$b$ which is a deeper position, so that a decrease in the number of p type impurities caused by the outward diffusion can be suppressed.

Particularly, in the semiconductor device according to the present embodiment, the inventors has set the impurity concentration at the one main surface F1 to be one tenth or less the impurity concentration at the first depth 13$b$, and thereby has found that the decrease in the number of p type impurities caused by the outward diffusion can be significantly suppressed. As a result, it is possible to obtain a desired breakdown voltage as designed in actually manufactured semiconductor devices.

Further, in the semiconductor device according to the present embodiment, the impurity concentration at the one main surface F1 in the junction termination extended region 13 is higher than the impurity concentration in the drift layer 10b. Therefore, it is possible to suppress carrier retention at the time of voltage application, which is caused by the surface region of the drift layer 10b becoming n type by the outward diffusion. As a result, a desired breakdown voltage can be stably obtained.

Further, in the semiconductor device according to the present embodiment, the distribution of the impurity concentration in the depth direction from the one main surface F1 has two peaks at the first depth 13b and the second depth 13a. Therefore, by reducing the difference in impurity concentration between the first depth 13b and the second depth 13a, the distribution of the impurity concentration in the junction termination extended region 13 can be made closer to the box-shaped impurity concentration distribution. As a result, as described above, it is possible to design the breakdown voltage with the dose amount as a control variable, as in the conventional case, while suppressing the decrease in the number of p type impurities due to the out diffusion.

(Semiconductor Device Manufacturing Method)

Hereinafter, a semiconductor device manufacturing method according to the present embodiment will be described with reference to FIGS. 3 to 6.

Figure 3:
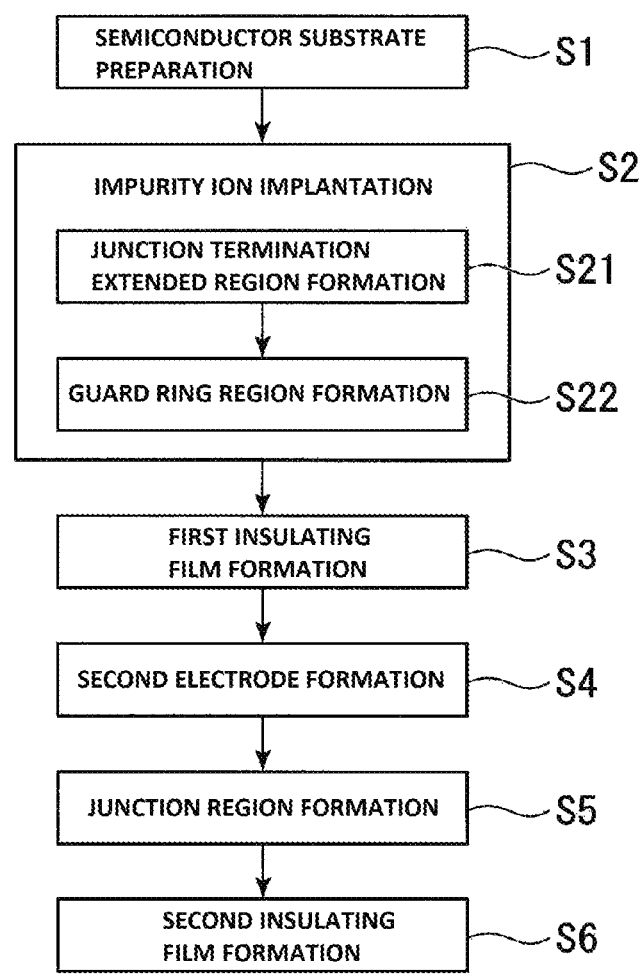
FIG. 3 is a flowchart showing a semiconductor device manufacturing method according to the first embodiment.

As shown in FIG. 3, the semiconductor device manufacturing method according to the present embodiment includes a semiconductor substrate preparation step S1, an impurity ion implantation step S2, a first insulating film formation step S3, a second electrode formation step S4, a junction region formation step S5, and a second insulating film formation step S6. The impurity ion implantation step S2 includes a junction termination extended region formation step S21 and a guard ring region formation step S22.

Hereinafter, each step of the semiconductor device manufacturing method according to the present embodiment will be described with reference to FIGS. 4 to 6. Here, in the manufacturing method according to the present embodiment, although a plurality of semiconductor devices are arranged adjacent to one another, FIGS. 4 to 6 show only one of these semiconductor devices.

(S1: Semiconductor Substrate Preparation Step)

Figure 4A:
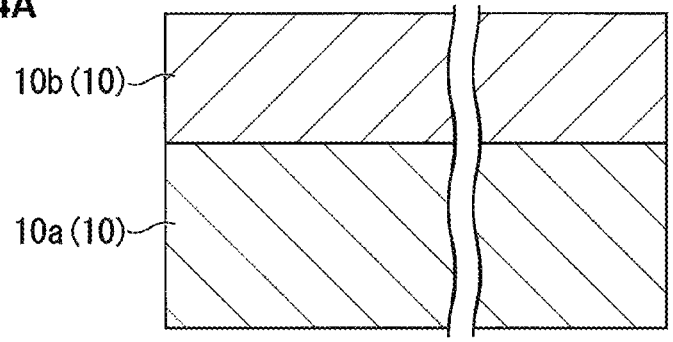
FIGS. 4A to 4C are cross-sectional views showing the semiconductor device manufacturing method according to the first embodiment.

First, the semiconductor substrate preparation step S1 shown in FIG. 4A is performed. In the semiconductor substrate preparation step S1, an n− type silicon carbide epitaxial layer is formed on an upper surface of an n+ type silicon carbide single crystal substrate by chemical vapor deposition (CVD). Thus, the semiconductor substrate 10 is formed in which the n type drift layer 10b made of the n−type silicon carbide epitaxial layer is formed on the one main surface of the n type semiconductor substrate 10a made of silicon carbide.

(S2: Impurity Ion Implantation Step)

Next, the impurity ion implantation step S2 is performed. In the impurity ion implantation step S2, the junction termination extended region formation step S21 shown in FIG. 4B and the guard ring region formation step S22 shown in FIG. 4C are sequentially performed.

(S21: Junction Termination Extended Region Formation Step)

In the junction termination extended region formation step S21, first, the one main surface F1 of the drift layer 10b is cleaned. Next, an oxide film (not shown) made of silicon dioxide ($SiO_2$) is formed on the one main surface F1 of the drift layer 10b. Next, the oxide film at a portion where the p type impurity ions are introduced is etched by reactive ion etching (RIE) to form a mask (not shown) having an opening at a portion corresponding to the junction termination extended region 13.

Figure 4B:
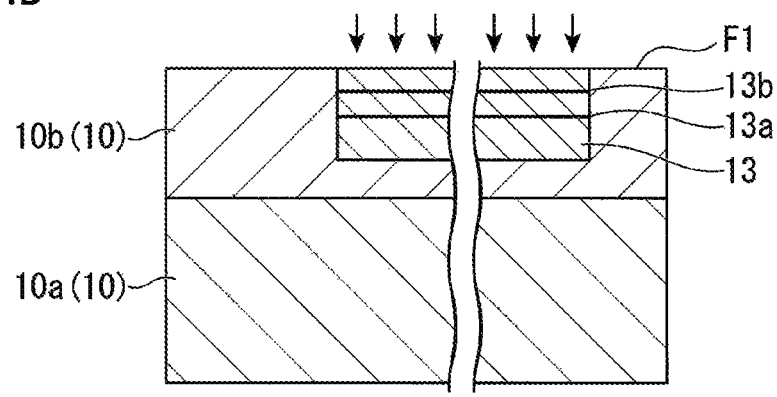
Figure 4C:
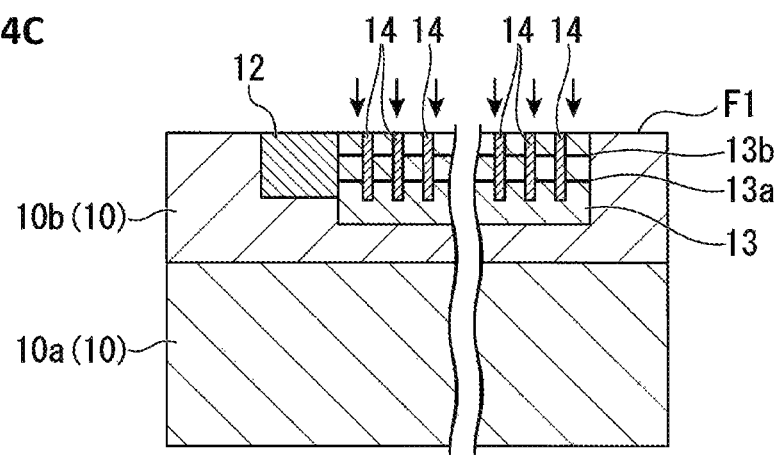

In this state, as shown in FIG. 4B, a relatively low concentration of p type impurity ions (for example, aluminum ions) is introduced into the drift layer 10b by ion implantation. Ion implantation is performed twice. The first ion implantation is performed with relatively high energy. As a result, a distribution of impurity concentration having a peak at the second depth 13a is formed. The second ion implantation is performed with lower energy than that of the first ion implantation. As a result, a distribution of impurity concentration having a peak at the first depth 13b is formed.

In the second ion implantation, the impurity concentration is formed so as to increase from the one main surface F1 down to the first depth 13b. Additionally, in the second ion implantation, the impurity concentration at the one main surface F1 is made one tenth or less the impurity concentration at the first depth 13b, and higher than the concentration of the n type impurity in the drift layer 10b.

After introducing the p type impurity, the mask is removed. Thereby, the p type junction termination extended region 13 exposed on the surface of the drift layer 10b is formed.

(S22: Guard Ring Region Formation Step)

In the guard ring region formation step S22, first, an oxide film (not shown) made of silicon dioxide is formed on the surface of the drift layer 10b. Next, the oxide film at a portion where the p type impurity ions are introduced is etched by reactive ion etching (RIE) to form a mask (not shown) having openings at portions corresponding respectively to the plurality of guard ring regions 14 and the p type region 12.

In this state, as shown in FIG. 4C, a relatively high concentration of p type impurity ions is introduced into the drift layer 10b by ion implantation. As a result, the plurality of guard ring regions 14 and the p type region 12 are formed.

In the junction termination extended region formation step S21 and the guard ring region formation step S22, activation annealing is performed after introducing the impurity by ion implantation. The temperature is preferably 1600° C. or higher.

In the junction termination extended region formation step S21, the order of the two ion implantations may be reversed. Further, in the guard ring region formation step S22, for example, the plurality of guard ring regions 14 and the p type region 12 may be formed separately.

(S3: First Insulating Film Formation Step)

Figure 5A:
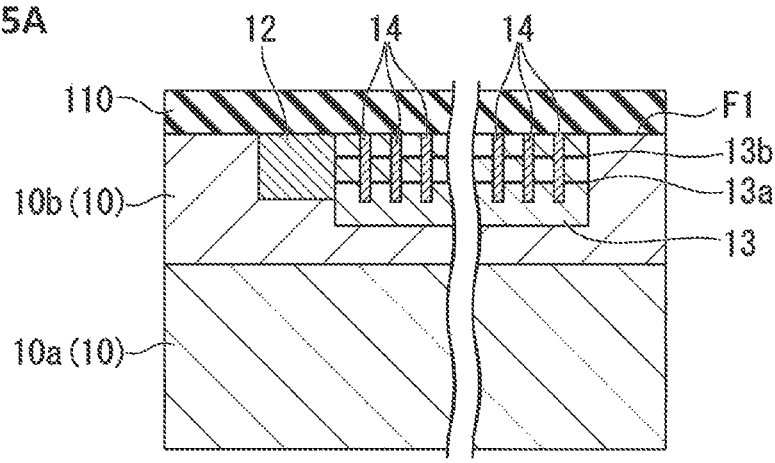
FIGS. 5A and 5B are cross-sectional views showing the semiconductor device manufacturing method according to the first embodiment.
Figure 5B:
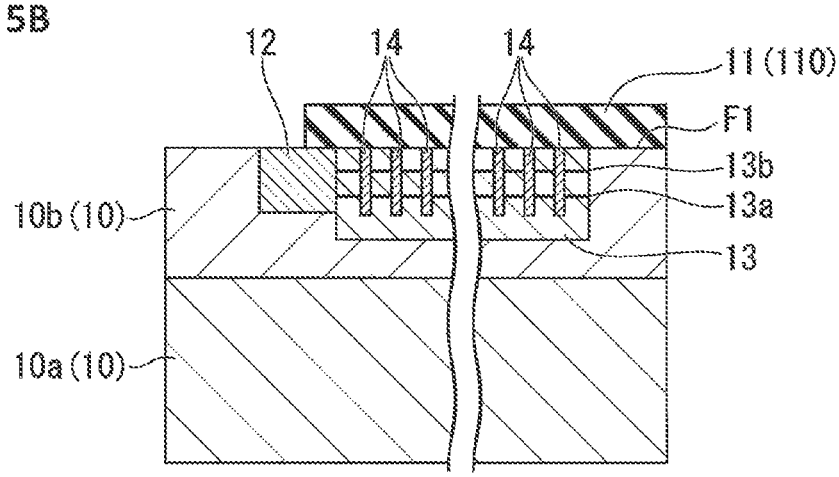

Next, the first insulating film formation step S3 shown in FIG. 5 is performed. In the first insulating film formation step S3, first, as shown in FIG. 5A, an oxide film 110 is formed by thermal oxidation on the entire one main surface F1 of the drift layer 10b. Next, as shown in FIG. 5B, an opening is formed in the oxide film 110 so that the n type region of the drift layer 10b surrounded by the p type region is exposed, thus forming the first insulating film 11.

(S4: Second Electrode Formation Step)

Figure 6A:
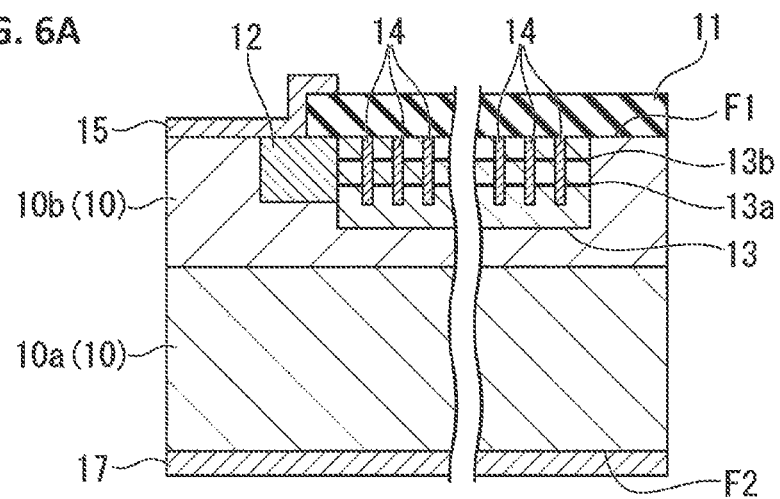
FIGS. 6A and 6B are cross-sectional views showing the semiconductor device manufacturing method according to the first embodiment.

Next, the second electrode formation step S4 is performed. In the second electrode formation step S4, as shown in FIG. 6A, the second electrode 17 is formed on the entire surface (the above-described other main surface) F2 of the semiconductor substrate 10a by sputtering or the like.
(S5: Junction Region Formation Step)

Next, as shown in FIG. 6A, a junction region formation step S5 is performed. In the junction region formation step S5, after a mask (not shown) having an opening at a portion corresponding to the first electrode 15 is formed on the first insulating film 11, the first electrode 15 is formed by using sputtering or the like. Thereafter, the mask is removed.
(S6: Second Insulating Film Formation Step)

Figure 6B:
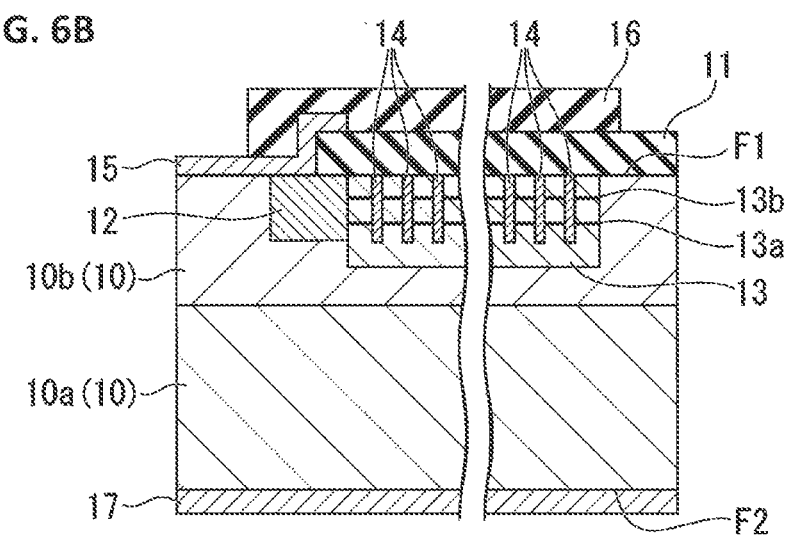

Finally, as shown in FIG. 6B, the second insulating film formation step S6 is performed. In the second insulating film formation step S6, the second insulating film 16 made of silicon dioxide is laminated and formed on the first insulating film 11 and the first electrode 15 by using, for example, plasma CVD.

According to the semiconductor device manufacturing method of the present embodiment, in the junction termination extended region formation step S21, the junction termination extended region 13 is formed so that the distribution of the impurity concentration in the depth direction from the one main surface F1 increases from the one main surface F1 down to the first depth 13b. Accordingly, after the introduction of the impurity, while the drift layer 10b is heated, even if a larger proportion of the impurity diffuses in the vicinity of the one main surface F1 (surface) than in the inside (bulk region), the amount of the p type impurity introduced in the vicinity of the one main surface F1 (surface) before the heating is lower than the amount of the p type impurity introduced at the first depth 13b which is a deeper position, so that a decrease in the number of p type impurities due to the outward diffusion can be suppressed.

In particular, in the semiconductor device manufacturing method according to the present embodiment, the inventors have set the impurity concentration at the one main surface F1 to one tenth or less the impurity concentration at the first depth 13b, and thereby have found that the decrease in the number of p type impurities due to the outward diffusion at that time of manufacturing can be significantly suppressed. As a result, it is possible to obtain a desired breakdown voltage as designed in actually manufactured semiconductor devices.

Further, according to the semiconductor device manufacturing method according to the present embodiment, the junction termination extended region 13 is formed so that the impurity concentration at the one main surface F1 is higher than the concentration of the n type impurity in the drift layer 10b. As a result, it is possible to suppress carrier retention at the time of voltage application, which is caused by the surface becoming n type due to the outward diffusion. As a result, a desired breakdown voltage can be stably obtained.

Second Embodiment

Hereinafter, a second embodiment of the present invention will be described. Description of parts common to the first embodiment will be omitted.
(Configuration of Semiconductor Device)

A semiconductor device of the present embodiment is a MOSFET. The semiconductor device of the present embodiment has the same configuration as that of the first embodiment, except that an n type source region is formed in a p type region, a source electrode is formed in a junction region, and a gate electrode is formed through an insulating film in a region surrounded by the p type region in plan view.

The semiconductor device of the present embodiment has the same effect as that of the first embodiment.
(Semiconductor Device Manufacturing Method)

A semiconductor device manufacturing method according to the present embodiment includes a semiconductor substrate preparation step S1, an impurity ion implantation step S2, a first insulating film formation step S3, a second electrode formation step S4, a junction region formation step S5, and a second insulating film formation step S6, which are the same as those in the first embodiment. The impurity ion implantation step S2 includes a junction termination extended region formation step S21 and a guard ring region formation step S22.

However, the present embodiment is different from the first embodiment in that the source electrode and the gate electrode are formed in the junction region formation step S5.

The semiconductor device manufacturing method according to the present embodiment has the same effects as those of the first embodiment.

Third Embodiment

Hereinafter, the third embodiment of the present invention will be described. Description of parts common to the first and second embodiments will be omitted.
(Configuration of Semiconductor Device)

A semiconductor device of the present embodiment is an insulated gate bipolar transistor (IGBT). The semiconductor device of the present embodiment has the same configuration as that of the second embodiment, except that a semiconductor substrate is of p+ type (second conductivity type). The semiconductor device of the present embodiment has the same effects as those of the first and second embodiments.
(Semiconductor Device Manufacturing Method)

A semiconductor device manufacturing method according to the present embodiment includes a semiconductor substrate preparation step S1, an impurity ion implantation step S2, a first insulating film formation step S3, a second electrode formation step S4, a junction region formation step S5, and a second insulating film formation step S6, which are the same as those in the first embodiment. The impurity ion implantation step S2 includes a junction termination extended region formation step S21 and a guard ring region formation step S22.

However, the present embodiment is different from the second embodiment in that the semiconductor substrate prepared in the semiconductor substrate preparation step S1 is of p+ type (second conductivity type).

The semiconductor device manufacturing method according to the present embodiment has the same effects as those of the first and second embodiments.

Example

Hereinafter, an example of the present invention will be described in comparison with a conventional semiconductor device with reference to FIGS. 9-12.

Figure 7:
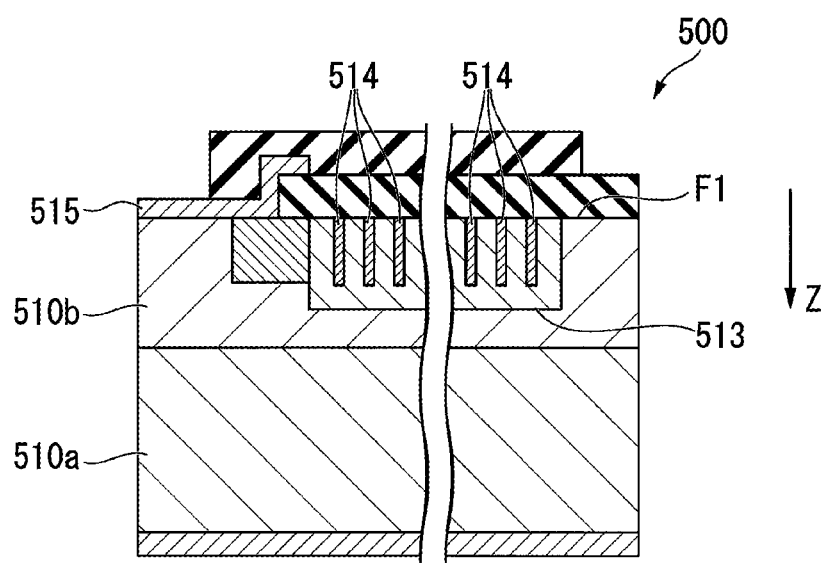
FIG. 7 is a cross-sectional view showing a semiconductor device having a conventional JTE+GR structure.
Figure 8:
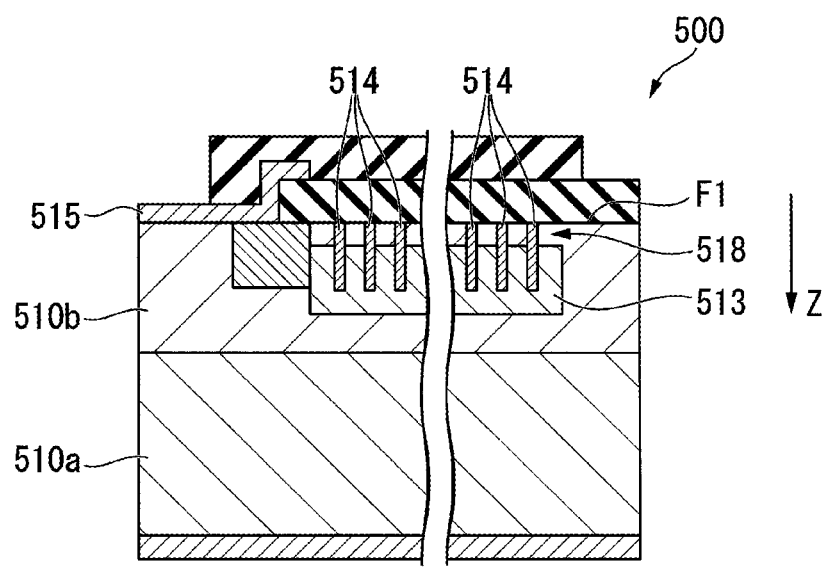
FIG. 8 is a cross-sectional view schematically showing that a surface of a junction termination extended region becomes n type in a conventional semiconductor device.
Figure 9:
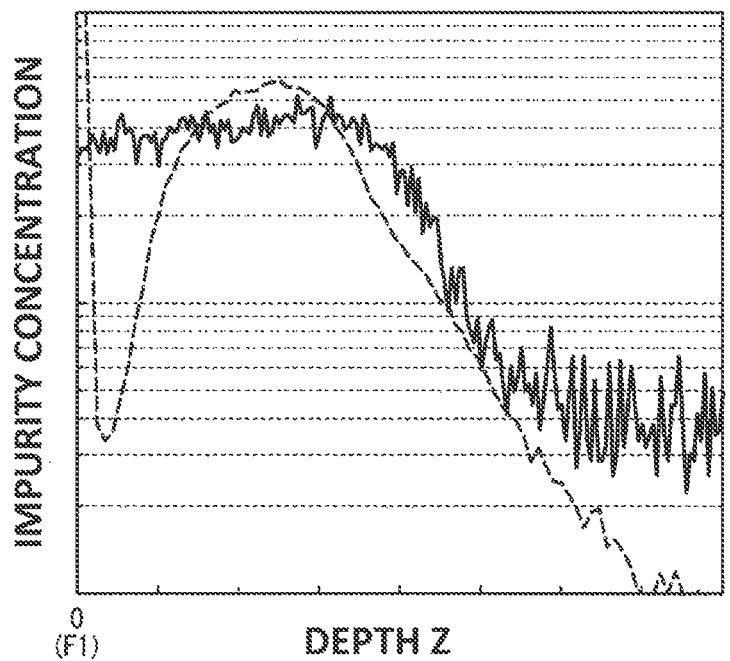
FIG. 9 is a graph showing depth dependency of impurity concentration in the conventional semiconductor device.

FIG. 9 is a graph schematically showing the impurity concentration with respect to the depth from the surface (first main surface F1) of the drift layer 510b in the conventional semiconductor device (see FIGS. 7 and 8). In FIG. 9, the impurity concentration is shown in logarithm. A solid line indicates the impurity concentration before an activation annealing step and a thermal oxidation step. A broken line indicates the impurity concentration after the activation annealing step and the thermal oxidation step. After the activation annealing step and the thermal oxidation step, the impurity concentration has been remarkably reduced in the vicinity of the surface of the drift layer 510*b*. That is, in the conventional semiconductor device, outward diffusion occurs after the activation annealing step and the thermal oxidation step.

Figure 10:
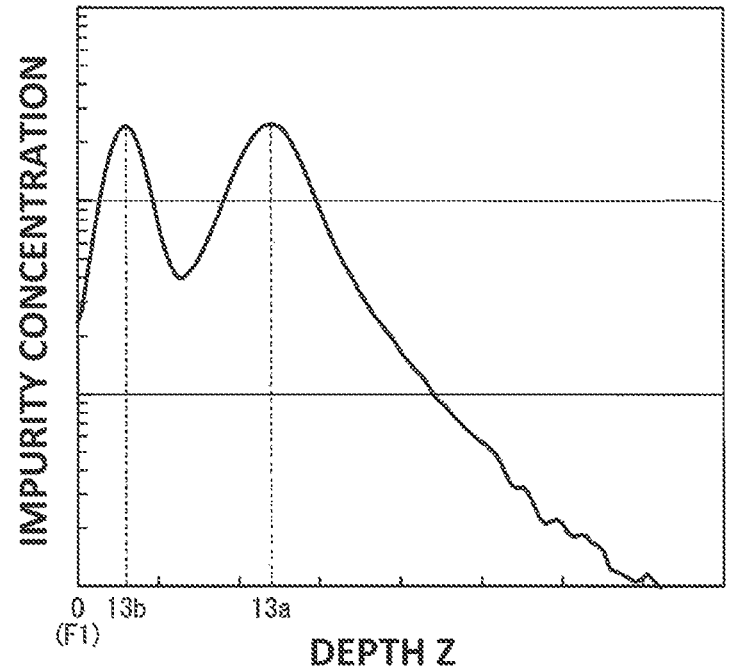
FIG. 10 is a graph showing depth dependency of impurity concentration in the semiconductor device of the present invention.

FIG. 10 is a graph showing the impurity concentration with respect to the depth from the surface (first main surface F1) of the drift layer 10*b* in the semiconductor device according to the present invention (see FIG. 1). In FIG. 10, the impurity concentration is shown in logarithm. According to the present invention, the impurity concentration at the one main surface F1 has been set to one tenth or less the impurity concentration at the first depth 13*b*, thereby suppressing a reduction in the number of p type impurities due to the outward diffusion at the time of manufacturing.

Figure 11:
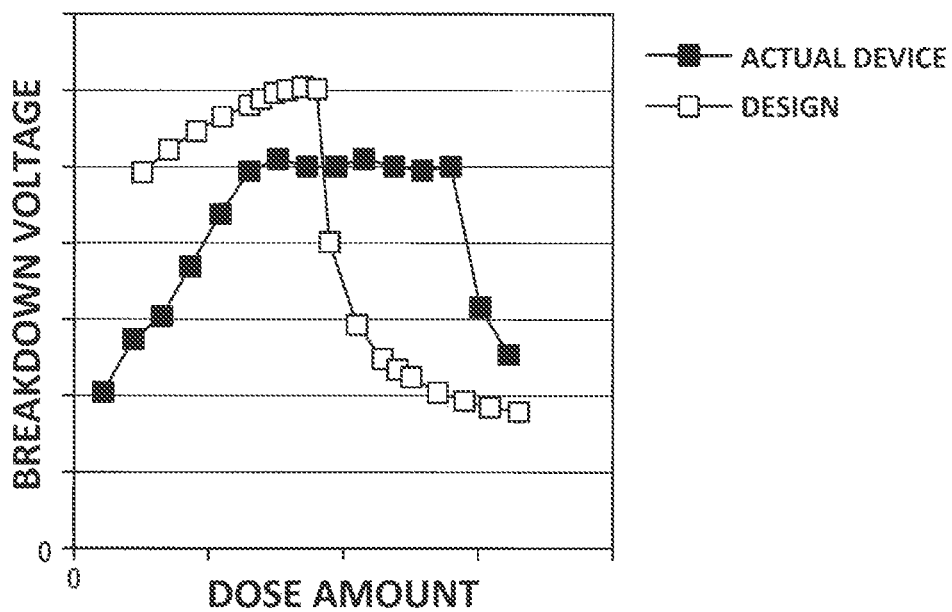
FIG. 11 is a graph showing dependency of a breakdown voltage on a dose amount in the conventional semiconductor device.

FIG. 11 is a graph showing the relationship between the dose amount of the p type impurity in the junction termination extended region 513 and the breakdown voltage of the semiconductor device, in the conventional semiconductor device (see FIGS. 7 and 8). A breakdown voltage curve designed by simulation has been largely deviated from a breakdown voltage curve of the actually manufactured device. Therefore, the conventional semiconductor device cannot obtain the breakdown voltage as designed.

Figure 12:
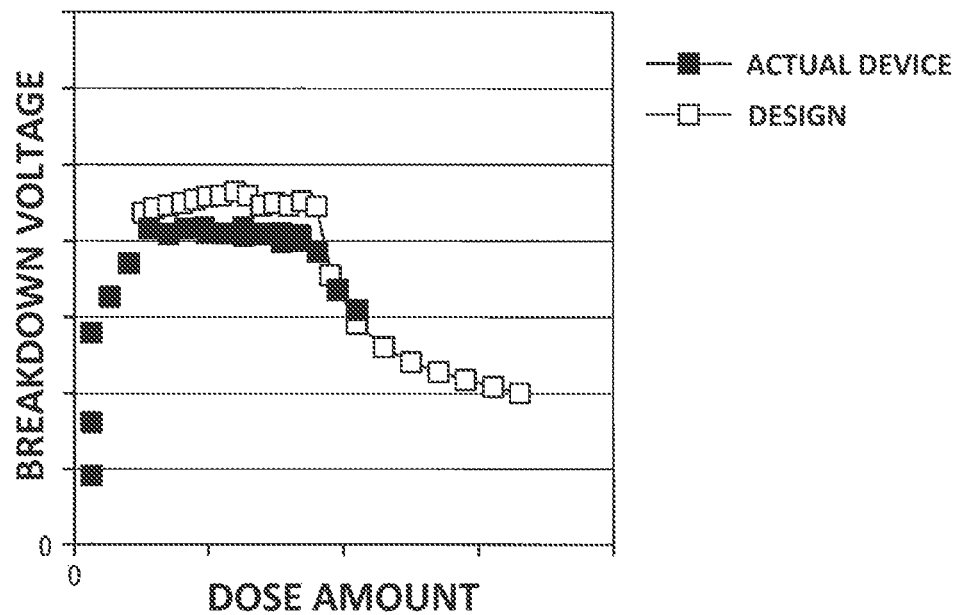
FIG. 12 is a graph showing dependency of a breakdown voltage on a dose amount in the semiconductor device of the present invention.

FIG. 12 is a graph showing the relationship between the dose amount of the p type impurity in the junction termination extended region 13 and the breakdown voltage of the semiconductor device, in the semiconductor device according to the present invention (see FIG. 1). The deviation between a breakdown voltage curve designed by simulation and a breakdown voltage curve of the actually manufactured device has been smaller than in the conventional case. Therefore, according to the present invention, it is possible to obtain a desired breakdown voltage as designed in actually manufactured semiconductor devices.

Although the embodiments of the present invention have been described above, the present invention can be implemented in other embodiments. Various design changes can be made within the scope of the matters described in the claims.

DESCRIPTION OF REFERENCE NUMERALS

1 . . . semiconductor device
10 . . . semiconductor substrate
10*a* . . . semiconductor substrate
10*b* . . . drift layer
F1 . . . one main surface
13 . . . junction termination extended region
13*a* . . . second depth
13*b* . . . first depth
14 . . . guard ring region
15 . . . first electrode (junction region)
S1 . . . semiconductor substrate preparation step
S2 . . . impurity ion implantation step
S21 . . . junction termination extended region formation step
S22 . . . guard ring region formation step
S3 . . . first insulating film formation step
S4 . . . second electrode formation step
S5 . . . junction region formation step
S6 . . . second insulating film formation step

The invention claimed is:

1. A semiconductor device comprising:
a drift layer of a first conductivity type which is made of silicon carbide;
a junction region formed on one main surface of the drift layer;
a junction termination extended region of the drift layer, the junction termination extended region being formed outside the junction region when the one main surface is viewed in plan view, and the junction termination extended region containing an impurity of a second conductivity type opposite to the first conductivity type; and
a guard ring region of the drift layer, the guard ring region being formed at a position overlapping the junction termination extended region when the one main surface is viewed in plan view, and the guard ring region containing the impurity of the second conductivity type with a concentration that is higher than that of the junction termination extended region, wherein
in the junction termination extended region,
the concentration of the impurity of the second conductivity type in a depth direction from the one main surface increases from the one main surface down to a first depth,
the concentration of the impurity of the second conductivity type at the one main surface is one tenth or less the concentration of the impurity of the second conductivity type at the first depth and is higher than a concentration of an impurity of the first conductivity type of the drift layer, and
a concentration distribution of the impurity of the second conductivity type in the depth direction from the one main surface has two peaks.

2. The semiconductor device according to claim 1, wherein
the semiconductor device is a Schottky diode.

3. The semiconductor device according to claim 1,
the semiconductor device is a MOSFET.

4. The semiconductor device according to claim 1, wherein
the semiconductor device is an IGBT.

5. A semiconductor device manufacturing method comprising:
a semiconductor substrate preparation step of preparing a semiconductor substrate including a drift layer of a first conductivity type which is made of silicon carbide;
a junction region formation step of forming a junction region on one main surface of the drift layer;
a junction termination extended region formation step of introducing from the one main surface into the drift layer, an impurity of a second conductivity type opposite to the first conductivity type, thus forming a junction termination extended region outside the junction region when the one main surface is viewed in plan view; and
a guard ring region formation step of introducing from the one main surface into the drift layer, the impurity of the second conductivity type with a concentration that is higher than that of the junction termination extended region, thus forming a guard ring region at a position overlapping the junction termination extended region when the one main surface is viewed in plan view, wherein
in the junction termination extended region formation step, the junction termination extended region is formed so that
the concentration of the impurity of the second conductivity type in a depth direction from the one main surface increases from the one main surface down to a first depth, the concentration of the impurity of the second conductivity type at the one main surface is one tenth or less the concentration of the impurity of the second conductivity type at the first depth and is higher than a concentration of an impurity of the first conductivity type of the drift layer, and a concentration distribution of the impurity of the second conductivity type in the depth direction from the one main surface has two peaks.

6. The semiconductor device manufacturing method according to claim 5, wherein in the guard ring region formation step, the impurity of the second conductivity type is introduced into the drift layer by ion implantation.

\* \* \* \* \*